United States Patent
Oyewole et al.

(10) Patent No.: US 12,456,856 B2
(45) Date of Patent: Oct. 28, 2025

(54) OVERCURRENT PROTECTION OF POWER SEMICONDUCTOR PACKAGES USING INTEGRATED POSITIVE TEMPERATURE INDICATOR

(71) Applicant: Littelfuse, Inc., Chicago, IL (US)

(72) Inventors: Oluwaseun Kehinde Oyewole, Chicago, IL (US); Cesar Martinez, Chicago, IL (US); Sergio Fuentes Godinez, Newark, CA (US); Francois Perraud, Chicago, IL (US); Marco Doms, Chicago, IL (US); Martin Pineda, Fremont, CA (US)

(73) Assignee: Littelfuse, Inc., Rosemont, IL (US)

(*) Notice: Subject to any disclaimer, the term of this patent is extended or adjusted under 35 U.S.C. 154(b) by 178 days.

(21) Appl. No.: 18/228,436

(22) Filed: Jul. 31, 2023

(65) Prior Publication Data

US 2025/0047091 A1 Feb. 6, 2025

(51) Int. Cl.
*H02H 5/04* (2006.01)

(52) U.S. Cl.
CPC ................................ *H02H 5/04* (2013.01)

(58) Field of Classification Search
CPC . H02H 5/04; H02H 5/042; H01C 7/02; H01C 7/021; H03K 2017/0806
See application file for complete search history.

(56) References Cited

U.S. PATENT DOCUMENTS

| 10,902,983 B2 | 1/2021 | Rutter, Jr. | |
| 2012/0133427 A1* | 5/2012 | Kim | H01L 25/16 |
| | | | 327/564 |
| 2014/0247859 A1* | 9/2014 | Kim | G01K 7/42 |
| | | | 374/178 |
| 2019/0027796 A1* | 1/2019 | Matus | H01M 10/637 |

* cited by examiner

*Primary Examiner* — Thienvu V Tran
*Assistant Examiner* — Christopher J Clark
(74) *Attorney, Agent, or Firm* — KDW Firm PLLC

(57) ABSTRACT

A semiconductor device protection arrangement. The semiconductor device protection arrangement may include a semiconductor chip; a controller, coupled to the power semiconductor chip; and a temperature sensor, disposed in thermal contact with the semiconductor chip, where the temperature sensor includes a positive temperature indicator (PTI) component.

15 Claims, 4 Drawing Sheets

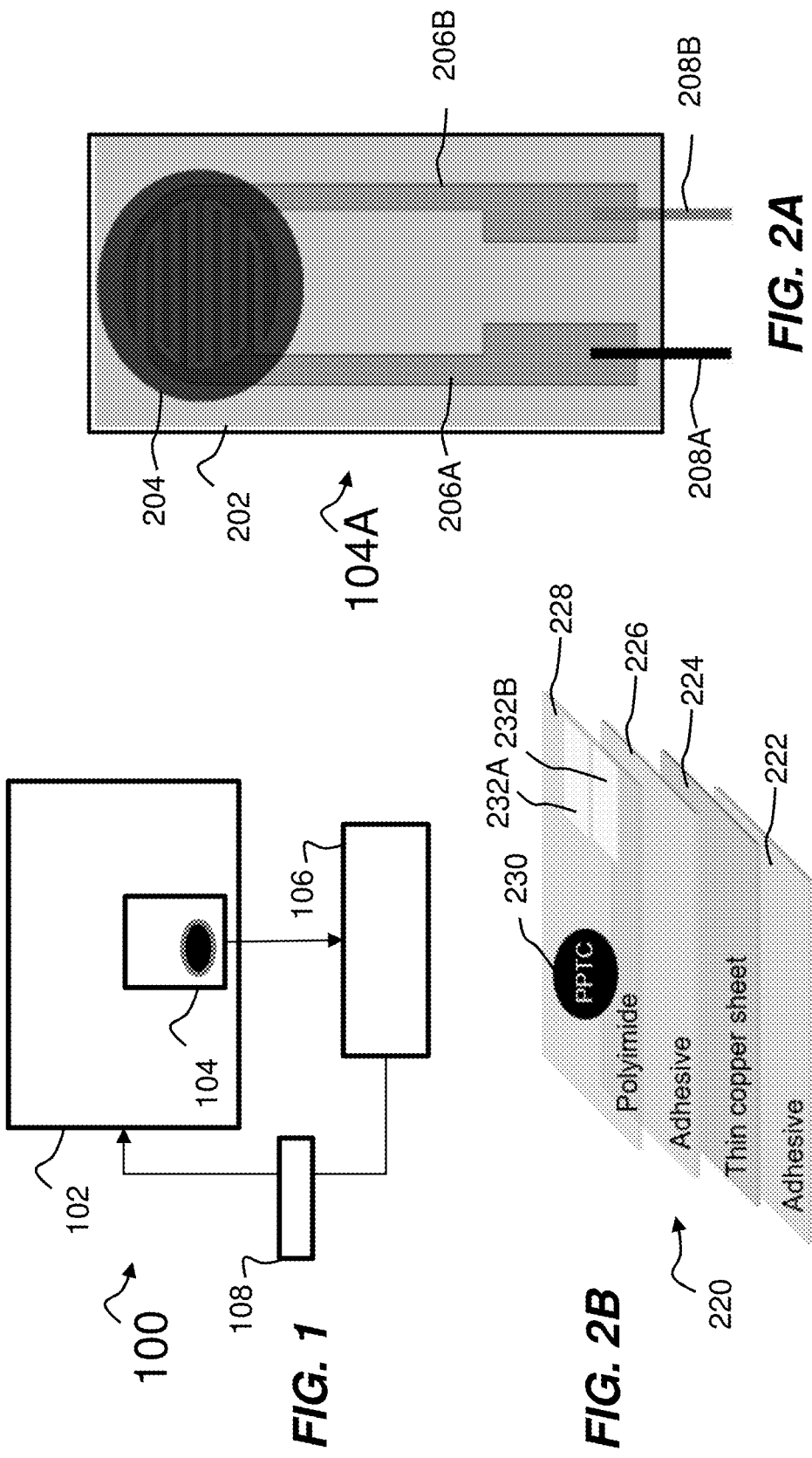

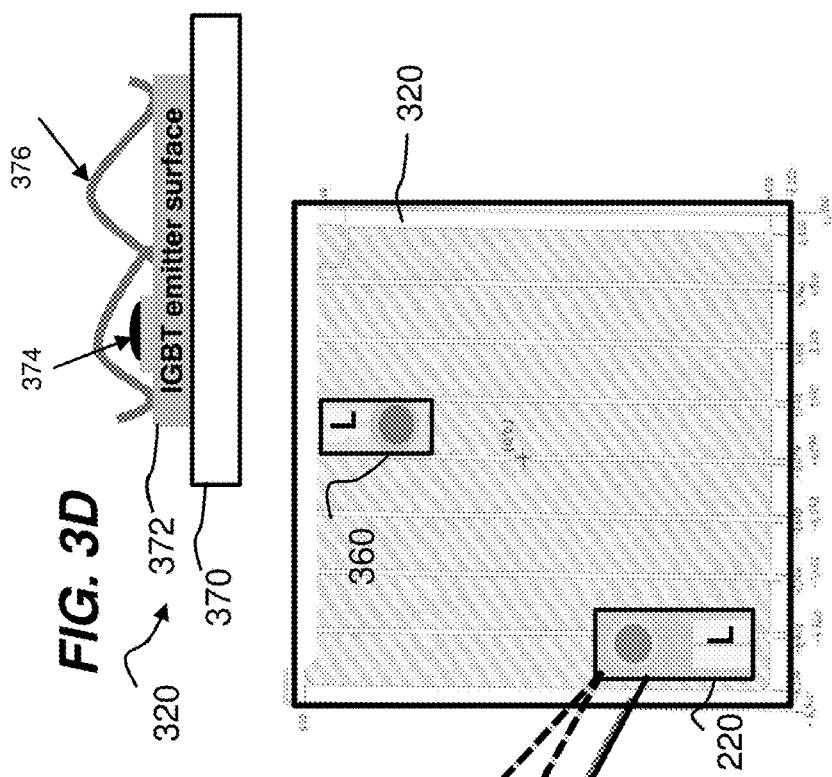
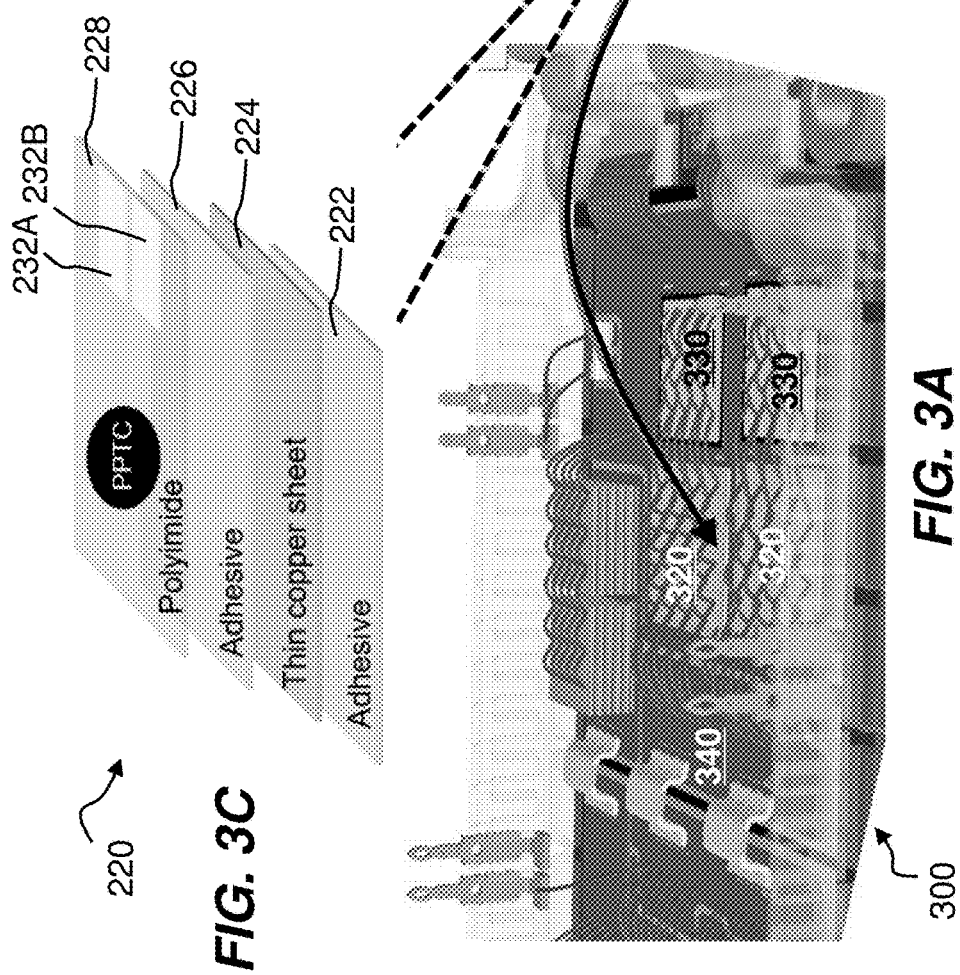
FIG. 3A
FIG. 3B
FIG. 3C
FIG. 3D

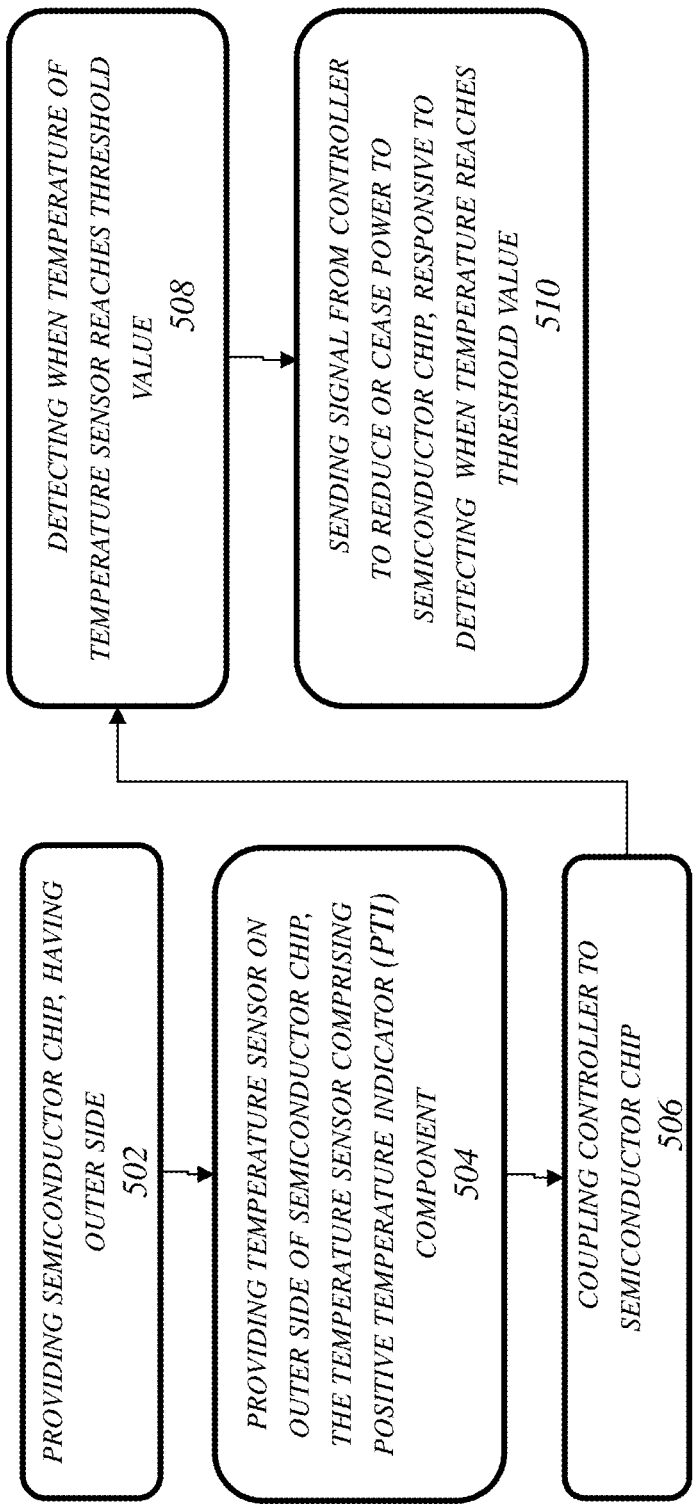

OVERCURRENT PROTECTION OF POWER SEMICONDUCTOR PACKAGES USING INTEGRATED POSITIVE TEMPERATURE INDICATOR

BACKGROUND

Field

Embodiments relate to the field of semiconductor devices, and in particular, protection arrangements for power semiconductor components in discrete of module type packaging.

Discussion of Related Art

Power semiconductor packages may include semiconductor devices such as field effect transistors (FETs), insulated gate bipolar transistors (IGBT) and other devices. FET-based semiconductors are designed to operate over a temperature range that may have an upper safe limit, such as an operation range below 175° C. Failure of the semiconductor device may occur when the device is exposed to temperatures in excess of the upper limit. To manage operation of semiconductor device packages, such as those packages based upon power semiconductors, a heat sink may be provided in thermal contact with the semiconductor device package to dissipate heat generated during operation of power semiconductor devices. However, such a passive means of regulating the temperature of a semiconductor chip may not ensure that the temperature of the semiconductor chip is maintained below the upper safe limit. Moreover, existing sense circuits used to protect semiconductor devices such as high power semiconductors are complicated, expensive and may add to power losses to the high power semiconductors.

In view of the above, the present embodiments are provided.

BRIEF SUMMARY

In one embodiment, a semiconductor device protection arrangement is provided. The arrangement may include a semiconductor chip, and a controller, coupled to the power semiconductor chip. The arrangement may further include a temperature sensor, disposed in thermal contact with the semiconductor chip, where the temperature sensor includes a positive temperature indicator (PTI) component.

In another embodiment, a semiconductor device package module is provided. The module may include a substrate, a semiconductor chip assembly, comprising at least one power semiconductor chip, disposed on the substrate, and a controller, coupled to the at least one power semiconductor chip. The module may further include a temperature sensor, disposed on the semiconductor chip, the temperature sensor comprising a positive temperature indicator (PTI) component.

In a further embodiment, a method of protecting a semiconductor device is provided. The method may include providing a semiconductor chip, wherein a temperature sensor is disposed on an outer side of the semiconductor chip, where the temperature sensor includes a positive temperature indicator (PTI) component. The method may also include coupling a controller to the semiconductor chip, detecting when a temperature of the temperature sensor reaches a threshold value, and sending a signal from the controller to reduce or cease power to the semiconductor chip when the temperature, responsive the detecting the temperature.

BRIEF DESCRIPTION OF THE DRAWINGS

FIG. 1 depicts a semiconductor device protection arrangement according to some embodiments of the disclosure;

FIG. 2A depicts a top view of a positive temperature indicator sensor according to various embodiments of the disclosure;

FIG. 2B depicts an exploded view of a positive temperature indicator sensor according to some embodiments of the disclosure;

FIG. 3A depicts an isometric view of a semiconductor device package assembly according to additional embodiments of the disclosure;

FIG. 3B depicts a top view of a semiconductor chip that may be used in the package assembly of FIG. 3A, according to some embodiments;

FIG. 3C depicts an exploded view of a positive temperature indicator sensor that may be employed in the semiconductor chip of FIG. 3B, according to some embodiments of the disclosure;

FIG. 3D depicts a side view of a positive temperature indicator sensor that may be employed in the semiconductor device of FIG. 3B, according to some embodiments of the disclosure;

FIG. 5 shows an exemplary process flow.

DESCRIPTION OF EMBODIMENTS

Figures 4A, 4B, 4C:
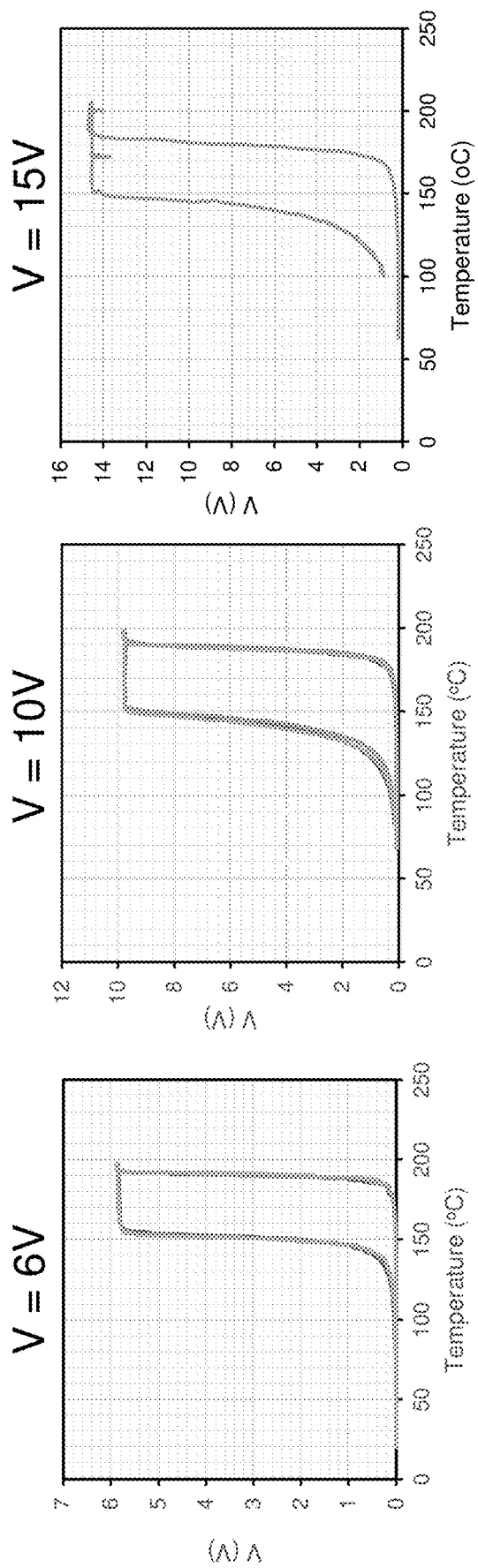
FIG. 4A depicts a graph showing the voltage versus temperature behavior of a positive temperature indicator according to embodiments of the disclosure, at a first applied voltage.
FIG. 4B depicts a graph showing the voltage versus temperature behavior of a positive temperature indicator according to embodiments of the disclosure, at a second applied voltage.
FIG. 4C depicts a graph showing the voltage versus temperature behavior of a positive temperature indicator according to embodiments of the disclosure, at a third applied voltage.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, a semiconductor device and semiconductor device package are disclosed, having a novel protection arrangement based upon a surface sensor structure. Turning to the figures, FIG. 1 depicts a semiconductor device protection arrangement 100 according to some embodiments of the disclosure. The semiconductor device protection arrangement 100 may be implemented to limit the operation of a semiconductor chip 102. The semiconductor chip 102 may be a power semiconductor die, such as a field effect transistor (FET), insulated gate bipolar transistor (IGBT) or other power semiconductor die, as known in the art. During operation, the semiconductor chip 102 may generate power that is dissipated at least in part as heat, such that the semiconductor chip 102 may operate over a range of temperature.

By way of reference, in order to arrange that temperature of a semiconductor chip does not exceed a safe limit, the operating conditions may be chosen in a manner that is calculated to limit the heat generated by the semiconductor chip. Known power semiconductor die may be designed to safely operate up to relatively high temperatures, such as 175 C. However, depending upon the variable power demands placed upon the semiconductor chip, and the environment of the semiconductor chip, such as the coupling to a heat sinks, the presence of nearby additional semiconductor chips, the temperature of a given semiconductor chip may exceed the safe limit.

To ensure that the safe operating temperature limit is not exceeded, according to the arrangement of FIG. 1, a temperature sensor 104 is arranged in a manner to be disposed in thermal contact with the semiconductor chip 102. In particular, the temperature sensor 104 may include a positive temperature component indicator. In particular the temperature sensor 104 may include a positive temperature indicator (PTI).

In various embodiments, as detailed below, the temperature sensor 104 may be arranged on a main surface of the semiconductor chip 102, such as an emitter surface of the semiconductor chip. In some embodiments, the temperature sensor 104 may be integrated with the semiconductor chip 102 as a pre-existing stamp. In some embodiments, the temperature sensor 104 may be formed at least in part by a printing process, such that the temperature sensor 104 may be deemed to be a printed sensor. In various embodiments, the temperature sensor 104 may be printed on a small portion of the area of the semiconductor chip 102, such as less than 20% of the area. In some embodiments, the temperature sensor 104 may represent a plurality of temperature sensors that are arranged at a plurality of different regions on the surface of the semiconductor chip 102, so as to locally measure the temperature at the plurality of different regions.

As shown in FIG. 1, the semiconductor device protection arrangement 100 may include a controller 106, which controller 106 may represent any suitable combination of hardware and software. The controller 106 is coupled to the semiconductor chip 102, and in particular is coupled to the temperature sensor 104, in order to receive an indication of the temperature of the semiconductor chip 102. The controller 106 may also be coupled to the semiconductor chip 102 in a feedback-type loop, either directly, or indirectly to regulate power or other signals provided to the semiconductor chip 102. Thus, during operation, the controller 106 may send a signal to restrict or prevent power to circuitry 108 that provides power the semiconductor chip 102, when the controller 106 receives a signal from the temperature sensor 104 that a temperature threshold has been met or exceeded.

FIG. 2A depicts a top view of an embodiment of a positive temperature indicator sensor, such as temperature sensor 104, according to various embodiments of the disclosure. In this view, the sensor is depicted as temperature sensor 104A, which sensor may be a rectangular structure having the width and length on the order of a millimeter or up to a few millimeters. The temperature sensor 104A includes an electrically insulating layer 202, such as a known material. In one example the electrically insulating layer 202 may be polyimide film or similar material. The electrically insulating layer 202 may be placed directly on an outer surface of a semiconductor chip, for example. The temperature sensor 104A may include a printed polymer positive temperature indicator, shown as PTI 204. In this example, the PTI 204 has a circular or elliptical shape, but may also have other shapes, such as a rectangular shape, oval shape, and so forth. In particular, the PTI may be formed of a known polymer positive temperature coefficient (PPTC) component, meaning a structure such as a dot, a planar structure, a disc, or other suitable structure that is formed of PPTC material.

The principle of operation of a PPTC material is well known and will not be detailed herein. In brief, a PPTC material is generally formed of an insulating matrix that is based upon a polymeric material, where the matrix includes an electrically conducting or semiconducting filler component. The filler component is generally arranged as microscopic or nanoscopic particles that form more or less continuous electrically conductive networks within the insulating matrix. At a temperature range below a trip temperature of the PPTC material the filler material is sufficiently compact that the PPTC material exhibits a relatively lower electrical resistivity. At a temperature range above the trip temperature, the conductive networks are broken due to expansion of the polymeric matrix, such that the PPTC material exhibits a relatively higher electrical resistivity. In various know PPTC materials, the relative change in electrical resistivity that takes place between temperatures above and below the trip temperature may be on the order of 10 times, 100 times, 1000 times, 10,000 times or more.

These inherent properties of a PPTC material may be harnessed in a number of ways, such as to regulate the current through a circuit that contains the PPTC material by causing the PPTC material to heat up due to resistive heating in response to current flow when the current flow is excessive, and thus transition to a high resistance state that subsequently limits current flow.

According to the present embodiments, the properties of a PPTC material may be harnessed in another fashion, by providing a signal, such as a voltage signal that indicates a trip temperature has been met or exceeded. To this end, the temperature sensor 104A is provided with a pair of electrical leads, shown as a first electrical lead 206A. The first electrical lead 206A may be disposed on the electrically insulating layer 202 and connected at a first location to a PTC component, such as a PPTC component, as represented by the PTI 204. A second electrical lead 206B is disposed on the electrically insulating layer 202 and connected to at a second location to the PTI 204. These two leads may be arranged such that electrical current will flow across a substantial portion of the PTI 204 when an external source, such as a voltage source or current source is coupled (via external lead 208A and external lead 208B) to the first electrical lead 206A and second electrical lead 206B.

Although not shown in FIG. 2A, the first electrical lead 206A and the second electrical lead 206B may be arranged in interdigitated form, that is, forming an interdigitated structure.

In operation of the temperature sensor 104A, below the trip temperature, when an external voltage or current is applied across the leads of the temperature sensor 104A, because of the relatively lower electrical resistivity, a relatively low voltage will develop across the temperature sensor 104A. Above the trip temperature, when an external voltage or current is applied across the leads of the temperature sensor 104A, because of the relatively higher electrical resistivity, a relatively high voltage will develop across the temperature sensor 104A

In some implementations, the temperature sensor 104A may be printed directly on a semiconductor chip. In some examples, the temperature sensor 104A may be formed of a single insulating layer that is affixed to the surface of the semiconductor chip. In other embodiments, the temperature sensor 104A may be formed of a multilayer structure that is applied to a semiconductor chip, as detailed below.

More particularly a sensor such as temperature sensor 104A may be applied as a pre-existing "stamp" to the top of metallization on the upper surface of a semiconductor chip. Alternatively, a top surface of metallization provided on the upper surface of a semiconductor chip may be first passivated with an insulating layer such as polyimide, followed by printing of a temperature sensor, including leads and PTI material on the polyimide. In this manner, the polyimide electrically insulates the top metallization from the electrical circuit of the sensor components.

FIG. 2B depicts an exploded view of a positive temperature indicator sensor, shown as temperature sensor 220, according to some embodiments of the disclosure. The temperature sensor 220 is formed of a plurality of layers as shown, including a lower adhesive layer 222, a metal support layer 224, disposed over the lower adhesive layer 222, an upper adhesive layer 226, disposed over the metal support layer 224, and an insulating layer 228, disposed above the upper adhesive layer 226. In some examples, the metal support layer may be a copper sheet. This stack of layers may be applied to an outer surface of a semiconductor chip to adhere the temperature sensor 220 to the semiconductor chip and to establish good thermal contact to the semiconductor chip. As with the embodiment of FIG. 2A, the insulating layer 228 may be a material such as polyimide and may incorporate a PTI, shown as PTI 230, which indicator may be formed of a PPTC material, as discussed previously. Electrical lead 232A and electrical lead 232B are connected to the PTI 230 and also provide respective rectangular regions toward the edge of the temperature sensor 220 to couple to external leads.

One suitable manner for fabricating the temperature sensor 220 is to apply the PTI 230 as a black ink that is formed from a carbon-particle-loaded polymeric material to form the PPTC matrix, such as polyvinylidene fluoride (PVDF) matrix, or other suitable polymers. Note that according to various embodiments, the polymeric matrix material of the PTI may be chosen according to the desired trip temperature for the temperature sensor 220. For example, PVDF may be chosen because this material exhibits a melting temperature of 177° C., which melting temperature is close to the trip temperature of a PPTC material formed from PVDF that is filled with carbon. Said differently, the melting temperature of a given polymer matrix temperature will correspond to a temperature at which a PPTC material formed from the given polymer matrix will undergo a trip temperature due to the relatively large volumetric expansion of the matrix associated with the melting temperature. Thus, PVDF may be a suitable polymer for the PTI for applications where a semiconductor chip is to be prevented from exceeding temperatures of approximately 180° C. or so, since a strong change in voltage may be observed across the temperature sensor 220 above such temperatures. However, other polymeric materials may be suitable for use in the temperature sensor 220 for protecting semiconductor chips, such as polymers having a lower melting temperature, in the case where the semiconductor chip is to be prevented from heating above 150° C., for example.

Once the PTI 230 is deposited as an ink, such as a printed ink, the temperature sensor 220 may be heated to cure the ink to form the final sensor structure. The use of the metal support layer 224, while being an optional embodiment, serves to help avoid warpage of the insulating layer 228 after curing of the PTI 230.

In operation, the temperature sensor 104A, temperature sensor 220, or similar sensors, may be used to protect a semiconductor chip or an assembly of semiconductor chips in various environments, such as in a power semiconductor device package.

FIG. 3A depicts an isometric view of a semiconductor device package assembly 300, according to additional embodiments of the disclosure. This assembly may be considered a multi-chip module and may include additional components that are not shown, including a housing, a heatsink, and so forth. In the embodiment shown, one or more ceramic substrates are provided, where one ceramic substrate is shown as substrate 340. These substrates may be direct bonded copper substrates, direct bonded aluminum substrates, or other similar substrates as known in the art. As depicted in FIG. 3A, a plurality of semiconductor chips is disposed on the substrate 340. For example two of the substrate 340 are shown, which substrate may be a power semiconductor die, such as a MOSFET or IGBT. In addition, two of the substrate 330 are shown, which substrate may be a diode, for example. In this configuration, a temperature sensor that is arranged generally according to the aforementioned embodiments may be applied to the surface of one or more of the semiconductor chips shown.

FIG. 3B depicts a top view of a variant of the semiconductor chip 320 that may be used in the package assembly of FIG. 3A, according to some embodiments of the disclosure. A temperature sensor 220 may be applied toward a periphery or edge of the semiconductor chip, as shown. FIG. 3B depicts an alternative configuration of a temperature sensor, where a temperature sensor 360 may be employed that includes an insulating layer that is affixed directly to the semiconductor chip 320, without an intervening metal support layer.

In both examples of temperature sensors to be applied to the semiconductor chip 320, the respective sensor may be arranged so that leads L that are provided on the insulator layer are disposed toward the edge of the semiconductor chip 320, for coupling to an external circuit.

FIG. 3C depicts an exploded view of the temperature sensor 220, where the components of the temperature sensor 220 were previously described.

FIG. 3D depicts a side view of a positive temperature indicator sensor that may be employed in the semiconductor chip of FIG. 3B, according to some embodiments of the disclosure. In this view, an upper portion of the substrate 370 that forms the semiconductor chip 320 is shown, as well as a surface electrode 372, which electrode may represent a main terminal layer of the semiconductor chip 320, such as an emitter contact in the case of the semiconductor chip 320 being an IGBT. The semiconductor chip 320 may be contacted with a set of bond wires 376 as in known power semiconductor modules. A temperature sensor 374 is shown, disposed on the surface electrode 372, which sensor may represent one of the aforementioned configurations of temperature sensors, described with respect to FIGS. 2A-3C.

FIG. 4A depicts a graph showing the voltage versus temperature behavior of a positive temperature indicator according to embodiments of the disclosure, at a first applied voltage; FIG. 4B depicts a graph showing the voltage versus temperature behavior of a positive temperature indicator according to embodiments of the disclosure, at a second applied voltage; and FIG. 4C depicts a graph showing the voltage versus temperature behavior of a positive temperature indicator according to embodiments of the disclosure, at a third applied voltage. These graphs present empirical data for a PTI temperature sensor that is heated to approximately 200° C. under different applied external voltages, 6V, 10V, and 15V. In each of these graphs a voltage vs temperature curve is characterized by a hysteresis loop where the voltage increases rapidly at approximately 180° C. from a value close to zero to a maximum value characteristic of the applied voltage. This behavior indicates that the temperature sensor undergoes a trip transition at approximately 180° C., which transition temperature is characteristic of the PPTC material, in this case carbon-filled PVDF.

The right portion of the curve represents the behavior of the sensor upon heating, while the left portion of the curve represents the behavior of the sensor upon cooling. Note that this behavior is reversible and reproducible and thus the sensor producing the data of FIGS. 4A-4C may be reusable to record multiple events where the temperature reaches or exceeds approximately 180° C. In other words, upon cooling down the PTI temperature sensor resets quickly to a low-resistance state as the temperature decreases (cooling), causing the voltage to then decrease back to a nominally low value, close to zero volts in these examples. Thus, in operation, the PTI temperature sensor may also be used to generate a "low voltage" signal indicating that the semiconductor chip containing the PTI sensor is now at a safe operating temperature.

Moreover, because of the hysteresis behavior, the monitoring of the PTI sensor may also be used to readily determine when a semiconductor chip is back in a safe operating condition after an overtemperature event. In other words, after transitioning to a high resistance state above 175° C., the voltage of the PTI sensor does not significantly drop until cooling below approximately 150° C. Thus, a "low voltage" signal generated by the PTI sensor subsequent to an overtemperature event where the temperature may have exceeded 175° C., will provide assurance that the semiconductor chip is now well within a safe operating range (assuming the safe operating range to be up to 175° C.

The relative steepness of the hysteresis curves, especially upon heating, also shows that such a sensor may timely provide an indication of an over-temperature event, by generating a strong measurable voltage signal within several degrees of the targeted temperature. Moreover, such a PTI temperature sensor may be used to protect semiconductor device modules over a wide range of voltages, as shown.

FIG. 5 shows an exemplary process flow 500. At block 502, a semiconductor chip is provided. The semiconductor chip may be a power semiconductor chip, characterized by two opposing surfaces. An outer side (one of the main surfaces) of the semiconductor chip may be exposed in cases where the semiconductor chip is arranged on a substrate, such as a ceramic substrate.

At block 504, a temperature sensor is provided on the outer side of the semiconductor chip, where the temperature sensor includes a positive temperature indicator (PTI). Examples of a suitable PTI include a circuit formed using a PPTC material having two attached electrical leads. In some examples, as temperature sensor may be applied as a pre-existing "stamp" to the top of metallization on the upper surface of a semiconductor chip. Alternatively, a top surface of metallization provided on the upper surface of a semiconductor chip may be first passivated with an insulating layer such as polyimide, followed by printing of a temperature sensor, including leads and PTI material on the polyimide.

At block 506, a controller is coupled to the semiconductor chip. In particular, the controller may be coupled directly, or indirectly to receive signals from the temperature sensor.

At block 508, when a temperature of the temperature sensor reaches a threshold value, this event is detected, for example, at the controller, as a signal, such as a voltage signal. For example, the threshold value may be a determined temperature value that is not to be exceeded. Accordingly, the temperature sensor may be arranged to exhibit a much higher voltage when this threshold is reached, due to the tripping of a PPTC material at or near the threshold temperature.

At block 510, a signal is sent from the controller to reduce or cease power to the semiconductor chip, based upon the detecting that the temperature threshold has been reached. In this manner, the semiconductor chip may begin to cool.

In summary, the present embodiments provide a novel protection scheme by incorporating a PTI temperature sensor within a semiconductor chip, such as a power semiconductor device.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A semiconductor device protection arrangement, comprising:
   a semiconductor chip;
   a controller, coupled to the semiconductor chip; and
   a temperature sensor, disposed in thermal contact with the semiconductor chip, the temperature sensor comprising:
   a positive temperature indicator (PTI) component printed on an electrically insulating layer; and
   a thin copper sheet, disposed subjacent to the electrically insulating layer.

2. The semiconductor device protection arrangement of claim 1, the PTI, formed from a polymer positive temperature coefficient (PPTC) material.

3. The semiconductor device protection arrangement of claim 1, the temperature sensor comprising:
   a first electrical lead, disposed on the electrically insulating layer and connected at a first location to the PPTC component; and a second electrical lead, disposed on the electrically insulating layer and connected to at a second location to the PPTC component.

4. The semiconductor device protection arrangement of claim 3, the first electrical lead and the second electrical lead comprising an interdigitated structure.

5. The semiconductor device protection arrangement of claim 2, the PPTC material comprising a printed ink.

6. The semiconductor device protection arrangement of claim 2, the PPTC material comprising a polyvinylidene fluoride matrix and a carbon filler.

7. The semiconductor device protection arrangement of claim 1, wherein the semiconductor chip comprises a first main terminal layer, disposed on an outer surface of the semiconductor chip, wherein the temperature sensor is integrated on the first main terminal layer.

8. A semiconductor device package module, comprising:
a substrate;
a semiconductor chip assembly, comprising at least one power semiconductor chip, disposed on the substrate;
a controller, coupled to the at least one power semiconductor chip; and
a temperature sensor, disposed on the at least one power semiconductor chip, the temperature sensor comprising:
a printed positive temperature indicator (PPTI) component, formed from a polymer positive temperature coefficient (PPTC) component, wherein the PPTI component is printed on an electrically insulating layer; and
a copper sheet, disposed subjacent to the electrically insulating layer.

9. The semiconductor device package module of claim 8, the temperature sensor comprising:
a first electrical lead, disposed on the electrically insulating layer and connected at a first location to the PPTC component; and
a second electrical lead, disposed on the electrically insulating layer and connected to at a second location to the PPTC component.

10. The semiconductor device package module of claim 9, the first electrical lead and the second electrical lead comprising an interdigitated structure.

11. The semiconductor device package module of claim 8, the PPTC component comprising a printed ink.

12. The semiconductor device package module of claim 8, the PPTC component comprising a polyvinylidene fluoride matrix and a carbon filler.

13. The semiconductor device package module of claim 8, wherein the at least one power semiconductor chip comprises a first main terminal layer, disposed on an outer surface of the at least one power semiconductor chip, wherein the temperature sensor is integrated on the first main terminal layer.

14. A method of protecting a semiconductor device, comprising:
providing a semiconductor chip, wherein a temperature sensor is disposed on an outer side of the semiconductor chip, the temperature sensor comprising;
a positive temperature indicator (PTI) component printed on an electrically insulating layer; and
a copper sheet, disposed subjacent to the electrically insulating layer;
coupling a controller to the semiconductor chip;
detecting when a temperature of the temperature sensor reaches a threshold value; and
sending a signal from the controller to reduce or cease power to the semiconductor chip, responsive to the detecting when the temperature reaches the threshold value.

15. The method of claim 14, PTI formed from a polymer positive temperature coefficient (PPTC) material.

* * * * *